(12) United States Patent
Herrmann

(10) Patent No.: US 8,384,096 B2
(45) Date of Patent: Feb. 26, 2013

(54) SEMICONDUCTOR COMPONENT WITH OPTICALLY ACTIVE REGIONS WHICH PROVIDES HIGH OPTICAL OUTPUT POWER, AND METHOD FOR PRODUCING SAME

(75) Inventor: Siegfried Herrmann, Neukirchen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/675,050

(22) PCT Filed: Aug. 29, 2008

(86) PCT No.: PCT/DE2008/001449
§ 371 (c)(1),
(2), (4) Date: Jan. 17, 2011

(87) PCT Pub. No.: WO2009/030204
PCT Pub. Date: Mar. 12, 2009

(65) Prior Publication Data
US 2011/0101383 A1 May 5, 2011

(30) Foreign Application Priority Data

Sep. 4, 2007 (DE) .......................... 10 2007 041 896

(51) Int. Cl.
*H01L 29/18* (2006.01)
*H01L 33/00* (2010.01)
*H01L 27/15* (2006.01)
*H01L 29/26* (2006.01)
*H01L 31/12* (2006.01)
*H01L 29/06* (2006.01)
*H01L 31/0328* (2006.01)
*H01L 31/0336* (2006.01)
*H01L 31/072* (2006.01)
*H01L 31/109* (2006.01)
*H01L 21/00* (2006.01)

(52) U.S. Cl. ......... 257/88; 257/13; 257/79; 257/E27.12; 257/E33.001; 257/E33.013; 257/E33.014; 257/E33.047; 257/E33.058; 438/22; 438/27; 438/28; 438/34; 438/45

(58) Field of Classification Search .................... 257/13, 257/79, 88, E27.12, E33.001, E33.013, E33.014, 257/E33.047, E33.058; 438/22, 27, 28, 34, 438/45
See application file for complete search history.

(56) References Cited

U.S. PATENT DOCUMENTS 4,331,938 A * 5/1982 Limm et al. ............... 372/50.12
(Continued)

FOREIGN PATENT DOCUMENTS
DE 10 2004 039 897 3/2006
EP 1 947 693 7/2008
(Continued)

*Primary Examiner* — Ida M Soward
(74) *Attorney, Agent, or Firm* — Cozen O'Connor

(57) ABSTRACT

A semiconductor component comprising at least one optically active first region (112) for emitting electromagnetic radiation (130) in at least one emission direction and at least one optically active second region (122) for emitting electromagnetic radiation (130) in the at least one emission direction. The first region (112) is here arranged in a first layer (110) and the second region (122) in a second layer (120), the second layer (120) being arranged over the first layer (110) in the emission direction and comprising a first passage region (124) assigned to the first region (112), which first passage region is at least partially transmissive for the electromagnetic radiation (130) of the first region (112).

16 Claims, 9 Drawing Sheets

U.S. PATENT DOCUMENTS

| | | | |
|---|---|---|---|
| 4,960,660 A * | 10/1990 | Dubin et al. | 430/46.1 |
| 5,108,305 A | 4/1992 | Suzuki | |
| 5,382,811 A * | 1/1995 | Takahashi | 257/88 |
| 5,386,139 A * | 1/1995 | Idei et al. | 257/466 |
| 5,479,394 A * | 12/1995 | Yashima et al. | 369/275.1 |
| 6,682,207 B2 * | 1/2004 | Weber et al. | 362/293 |
| 6,794,688 B2 * | 9/2004 | Nakatsu et al. | 257/98 |
| 6,936,856 B2 * | 8/2005 | Guenther et al. | 257/89 |
| 6,989,280 B2 * | 1/2006 | Ko | 438/7 |
| 7,202,506 B1 * | 4/2007 | DenBaars et al. | 257/90 |
| 7,427,799 B2 * | 9/2008 | Kim | 257/440 |
| 7,973,401 B2 * | 7/2011 | Lin et al. | 257/686 |
| 2003/0025657 A1 | 2/2003 | Iwafuchi | |
| 2004/0079963 A1 * | 4/2004 | Taylor et al. | 257/183 |
| 2005/0253252 A1 | 11/2005 | Owen et al. | |
| 2006/0002142 A1 | 1/2006 | Jeong et al. | |
| 2006/0076566 A1 | 4/2006 | Ikeda | |
| 2008/0179622 A1 | 7/2008 | Herrmann | |

FOREIGN PATENT DOCUMENTS

| | | |
|---|---|---|
| JP | 6-68977 | 8/1994 |
| JP | 2007-115928 | 5/2007 |
| WO | WO 95/19525 | 7/1995 |
| WO | WO 01/43109 | 6/2001 |
| WO | WO 2005/099310 | 10/2005 |
| WO | WO 2006/012442 | 2/2006 |
| WO | WO 2006/054236 | 5/2006 |
| WO | WO 2007/016908 | 2/2007 |
| WO | WO 2008/014750 | 2/2008 |
| WO | WO 2008/092774 | 8/2008 |

* cited by examiner

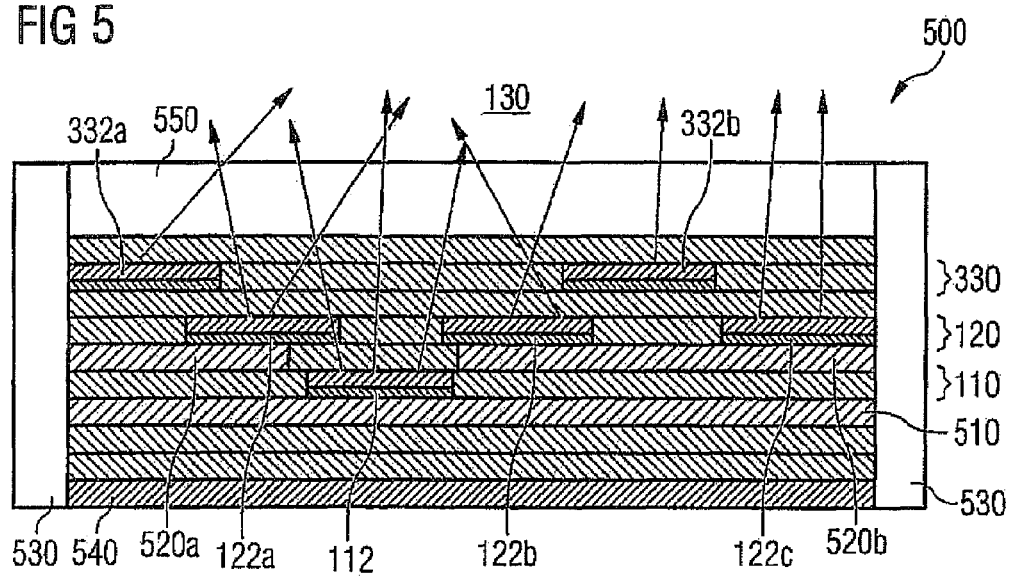
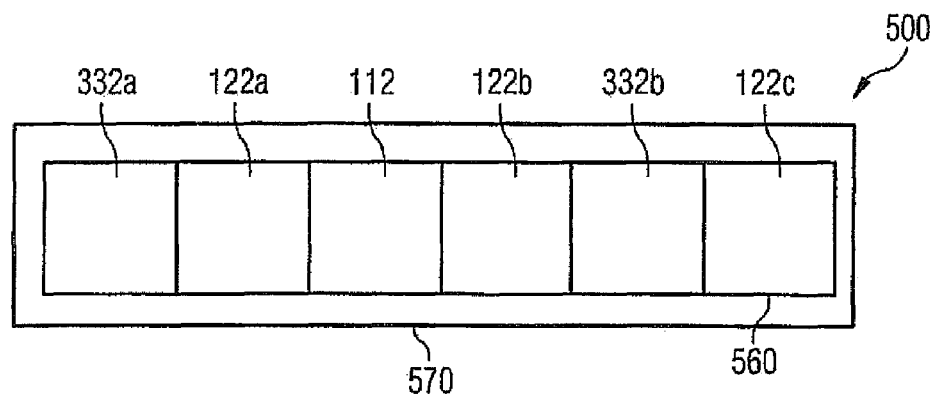
FIG 5

FIG 6
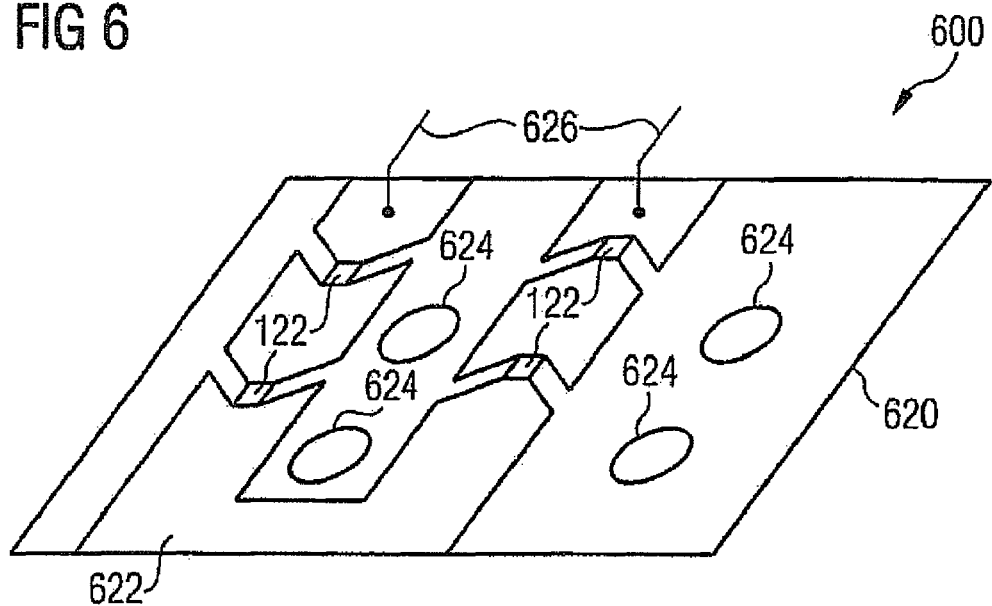
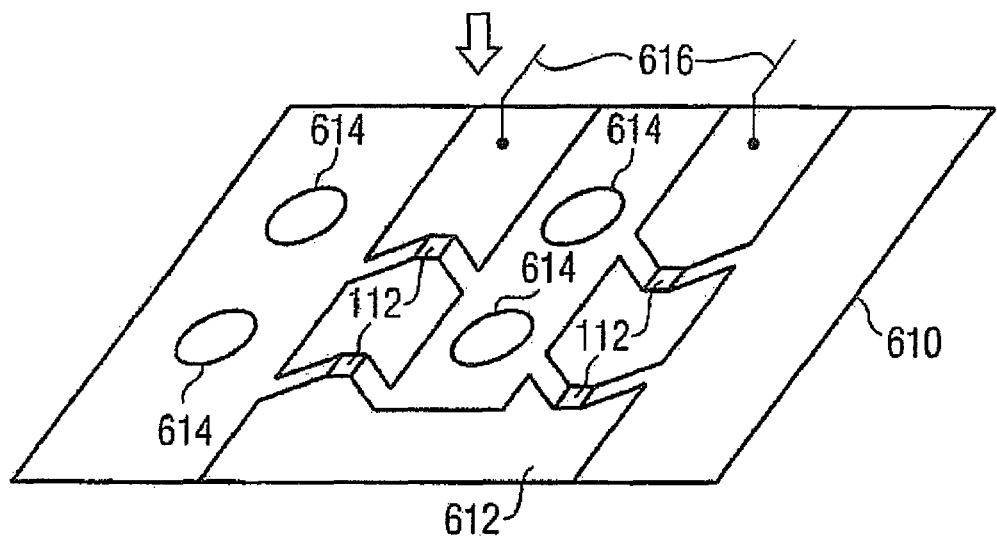

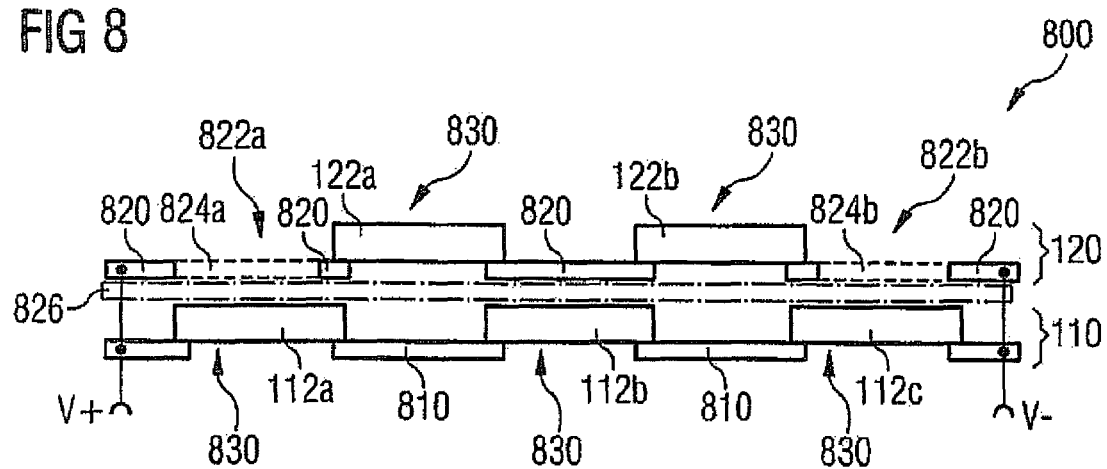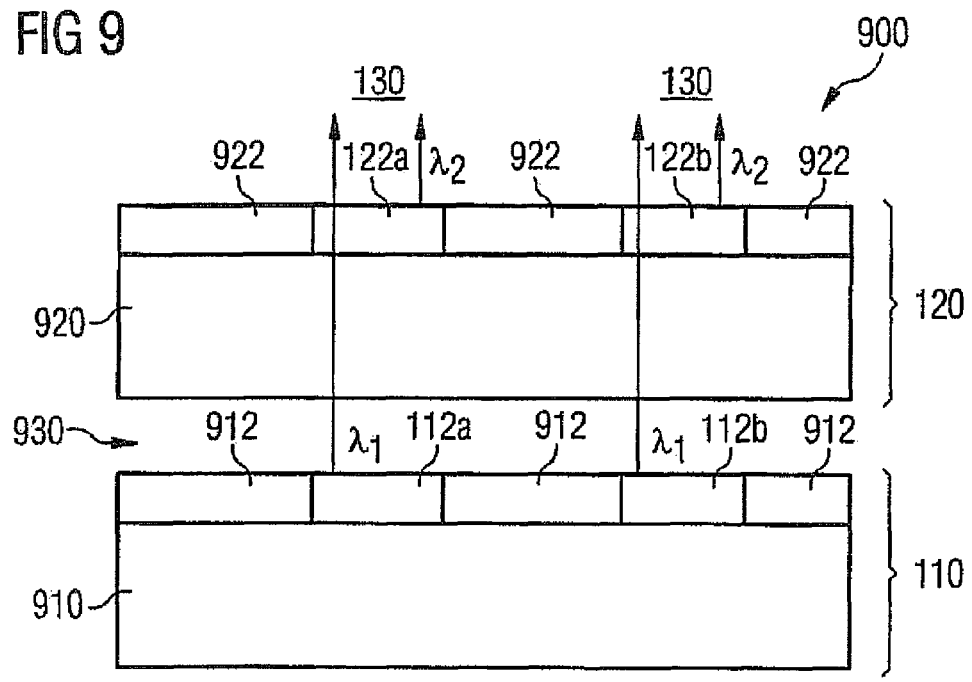

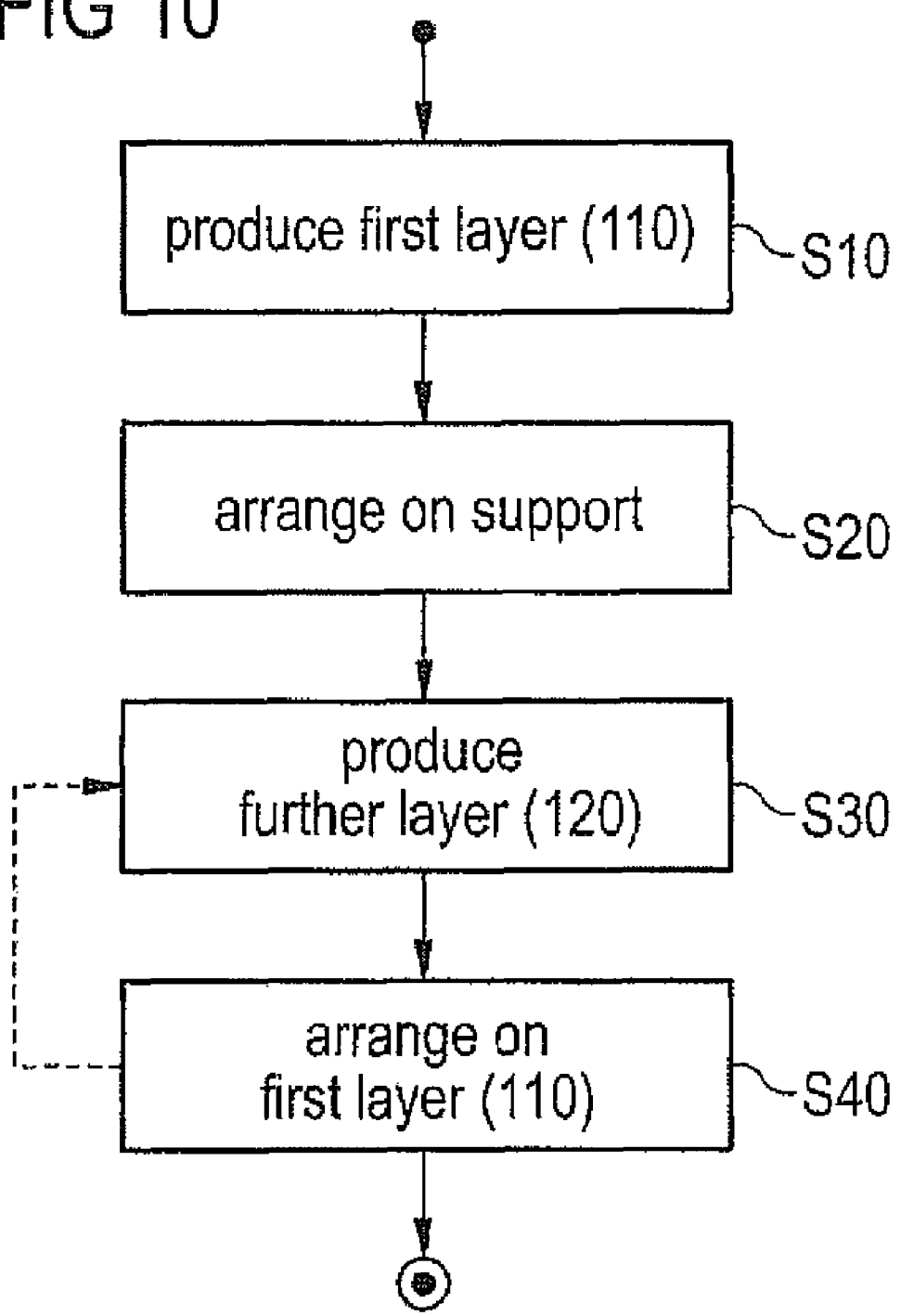

SEMICONDUCTOR COMPONENT WITH OPTICALLY ACTIVE REGIONS WHICH PROVIDES HIGH OPTICAL OUTPUT POWER, AND METHOD FOR PRODUCING SAME

RELATED APPLICATIONS

This is a U.S. national stage of application No. PCT/DE2008/001449, filed on Aug. 29, 2008.

This patent application claims priority from German patent application no. 10 2007 041 896.7 filed Sep. 4, 2007, the disclosure content of which is hereby incorporated by reference.

FIELD OF THE INVENTION

The present application relates to a semiconductor component comprising at least one optically active first region for emitting electromagnetic radiation in at least one emission direction and at least one optically active second region for emitting electromagnetic radiation in the at least one emission direction.

The present application also relates to a method of producing a semiconductor component.

BACKGROUND OF THE INVENTION

Many semiconductor components with optically active regions are known and are used in a large number of applications. In particular it is known to use semiconductor diode structures as radiation sources. It is known to arrange a plurality of optically active regions in a common housing or on a common substrate in order to make possible high-power and at the same time extensive radiation sources. WO 2006/012442 A2, for example, discloses an optoelectronic component with a housing body in which a plurality of semiconductor chips are arranged in a linear arrangement. Adjacent semiconductor chips are here spaced from one another.

SUMMARY OF THE INVENTION

It is an object of the invention to provide a semiconductor component which produces a high optical output power. Another object is for the component to have a high packing density or radiation density. Another object is to provide a production method for such a semiconductor component.

This object is achieved by a semiconductor component and a method of producing a semiconductor component according to the independent claims. Configurations and further developments of the semiconductor component are specified in the dependent claims. The disclosure content of the claims is hereby explicitly included in the description by reference.

These and other objects are attained in accordance with one aspect of the present invention directed to a semiconductor component of the above-stated type which is characterized in that the first region is arranged in a first layer and the second region in a second layer, the second layer being arranged over the first layer in the emission direction and comprising a first passage region assigned to the first region, which first passage region is at least partially transmissive for the electromagnetic radiation of the first region. In particular, the emission direction is understood to mean the direction of a surface normal of a main plane of extension of the first and/or second region.

By arranging a first layer with a first optically active region and a second layer with a second optically active region and a passage region one above the other, the area effectively used for the emission of electromagnetic radiation is enlarged, without the individual optically active regions being enlarged.

According to one configuration, the second layer comprises at least one cut-out in the first passage region to allow passage of the electromagnetic radiation of the first layer. The cut-out in the passage region allows unhindered emission of the electromagnetic radiation of the first layer through the second layer.

According to an alternative configuration, the second layer comprises at least one light-transmissive material in the first passage region, for example a transparent or semitransparent material, to allow passage of the electromagnetic radiation of the first layer. By using a transparent or semitransparent material, the electromagnetic radiation of the first layer at least partially penetrates the second layer. The transparent or semi-transparent material may be indium tin oxide (ITO), for example.

According to a further configuration, at least one interlayer of a metallic material is arranged between the first and second layers, which interlayer comprises at least one cut-out in a second passage region assigned to the first region. According to one configuration, the metallic material is operable to dissipate heat from the first and/or second layer, in particular from the first and/or second region. Alternatively or in addition, it may serve to establish at least one electrical contact to the first and/or second region. By using a metallic material in the semiconductor component, thermal or electrical contacting of the optically active regions is simplified.

According to a further advantageous configuration the first passage region and the second region are spatially adjacent and form a continuous emission region. By arranging the first passage region and the second region of the second layer adjacent one another, the impression of a continuous radiation source is produced in the emission direction.

According to a further configuration the at least first and second layers are arranged in a common housing body. According to different configurations, the housing body is coupled thermally or electrically to the first and/or the second layer and serves as a heat sink for the first and/or second region. Alternatively or in addition, it may serve as at least one terminal contact for the first and/or second region.

According to a further configuration, the housing body comprises an optical element, which converts electromagnetic radiation emitted by the first and/or second region in a predetermined manner, in particular by frequency conversion, diffraction, refraction and/or filtering. By combining the optically active regions with an optical element in a common housing body, an integrated component with predetermined optical characteristics is provided.

In a further development, the housing body is designed to be at least partially light-transmitting, in particular at least partially transparent. In this way the housing body itself serves as an optical element.

According to a further advantageous configuration the housing body comprises at least one first and one second contact on a mounting face and is adapted to being arranged on a support material using surface mounting. The use of two contacts on a mounting face of the housing body allows surface mounting of the semiconductor component.

According to a further configuration the first and/or the second region take the form of substrate-less semiconductor structures. By configuring the optically active regions as substrate-less semiconductor structures, particularly thin layers and thus particularly thin semiconductor components are produced.

A substrate-less semiconductor structure is in particular free of a growth substrate. "Free of a growth substrate" here means that a growth substrate optionally used for growth has been removed from the semiconductor structure or at least greatly thinned. In particular it has been thinned to such an extent that it is not self-supporting either alone or together with an epitaxial semiconductor structure layer sequence alone. The remaining remnant of the greatly thinned growth substrate is unsuited in particular as such to the function of a growth substrate.

The substrate-less semiconductor structure has a thickness in particular in the range of 20 μm or less, in particular in the range of 10 μm or less.

Examples of substrate-less semiconductor structures are described in document WO2008/014750, whose disclosure content in this respect is hereby incorporated by reference.

According to a further configuration, at least one cooling layer is arranged between the first and second layers for dissipating heat from the first and/or second region, which cooling layer is partially transparent at least in a second passage region assigned to the first region. Arranging an at least partially transparent cooling layer between the first and second layers makes possible effective cooling of the optically active regions.

In a further development of this configuration, the cooling layer contains a cavity, which is at least partially filled with a cooling liquid. In an advantageous further development the cooling liquid is actively pumped through the cavity.

According to a further advantageous configuration, the first region is configured to emit electromagnetic radiation of a first wavelength and the second region is configured to emit electromagnetic radiation of a second wavelength. By configuring the first and second regions differently to emit electromagnetic radiation of different wavelengths, the radiation pattern of the semiconductor component is adapted to predetermined requirements. For example, it is possible to produce a component for emitting differently coloured light.

According to a further advantageous configuration, the first and the second region are arranged one above the other in the emission direction. By arranging the first and second regions one above the other in the emission direction, the intensity or spectral composition of the emitted electromagnetic radiation is adapted to prevailing requirements by mixing.

According to a further advantageous configuration, the first and/or second layer comprise(s) a plurality of optically active regions for emitting electromagnetic radiation, a passage region of the second layer being assigned to each optically active region of the first layer. The radiation power of the semiconductor component is increased further by means of a plurality of optically active regions in one of the layers.

According to a further advantageous configuration the semiconductor component comprises a plurality of layers arranged one above the other with in each case at least one optically active region for emitting electromagnetic radiation, each overlying layer comprising at least one passage region for electromagnetic radiation from an underlying layer. The superposed arrangement of a plurality of layers arranged one above the other with in each case one optically active region and one passage region assigned to the underlying optically active region further increases the radiation power of the semiconductor component.

Another aspect of the present invention is directed to a method of producing a semiconductor component. The method comprises the following steps:

producing a first layer with at least one optically active first region for emitting electromagnetic radiation in at least one emission direction, arranging the first layer in a housing or on a support material, producing a second layer with at least one optically active second region for emitting electromagnetic radiation and at least one transparent or semitransparent passage region, and arranging the second layer on the first layer, the passage region of the second layer being arranged over the first region of the first layer in the passage direction.

BRIEF DESCRIPTION OF THE DRAWINGS

The invention is described below by way of exemplary embodiments and with reference to the following, schematic figures, in which the same reference numerals are used for comparable features in the different exemplary embodiments.

In the Figures:

FIG. 5 shows a cross-section and a plan view of a semiconductor component with a plurality of layers, FIG. 6 shows an arrangement comprising a plurality of optically active regions on two films, FIG. 8 shows a semiconductor component with second exemplary contacting, FIG. 9 shows an arrangement with a plurality of optically active regions arranged one above the other, and FIG. 10 shows a flowchart for a method of producing a semiconductor component.

DETAILED DESCRIPTION OF THE DRAWINGS

Figure 1:
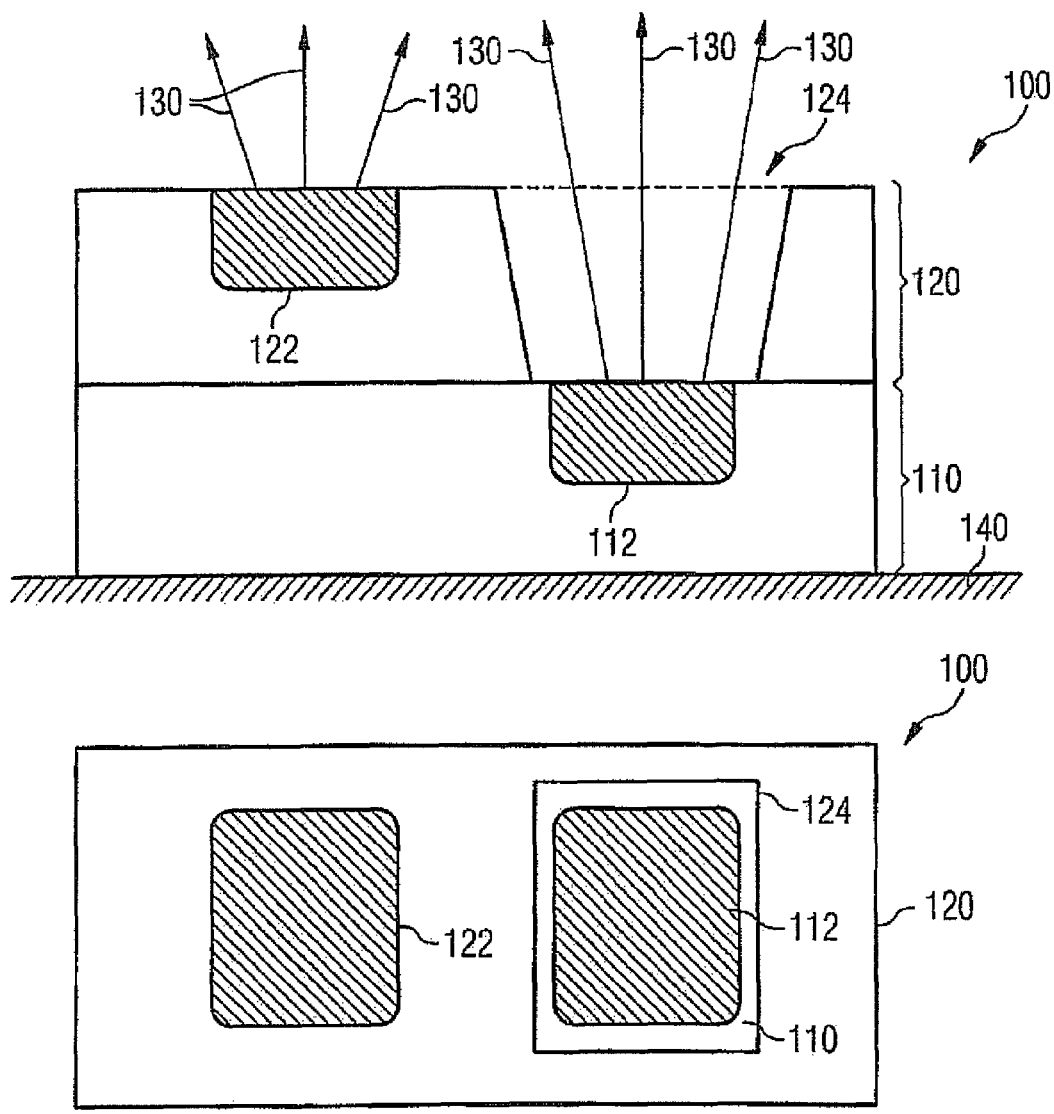
FIG. 1 shows a cross-section and a plan view of a semiconductor component with two layers.

FIG. 1 shows a semiconductor component 100 according to one embodiment of the invention. The top part of FIG. 1 shows a cross-section through the semiconductor component 100. The bottom part of FIG. 1 shows a plan view of the semiconductor component 100.

The cross-section reveals that the semiconductor component 100 comprises a first layer 110 and a second layer 120. A first optically active region 112 is arranged in the first layer 110. The second layer 120 comprises a second optically active region 122 and a first passage region 124. The first layer 110 is arranged on a support material 140, for example a printed circuit board or a semiconductor substrate.

The first passage region 124 of the second layer 120 is arranged over the first optically active region 112 of the first layer 110. As is clear from FIG. 1, both the first optically active region 112 and the second optically active region 122 emit electromagnetic radiation 130 in a common emission direction, this being upwards away from the support material 140 in the exemplary embodiment shown in the figure.

For example the first layer 110 and the second layer 120 may be a layer of a semiconductor substrate. The semiconductor substrate comprises diode structures which have been formed by doping semiconductor material with a positive or negative dopant and act as first and second optically active regions 112 and 122, respectively.

In the plan view also shown in FIG. 1 the first layer 110 of the semiconductor component 100 is largely covered by the second layer 120 thereof. This gives the impression of the first optically active region 112 and the second optically active region 122 being arranged in the same plane. In other words the optically active component 100 acts as a component with two optically active regions 112 and 122 in a common layer.

Since, however, the first optically active region 112 and the second optically active region 122 are actually arranged in the first layer 110 and in the second layer 120 respectively, the structure and functioning thereof may be simplified. In particular, simpler dissipation of heat generated in the first or second optical region 112 or 122 is made possible.

Figure 2:
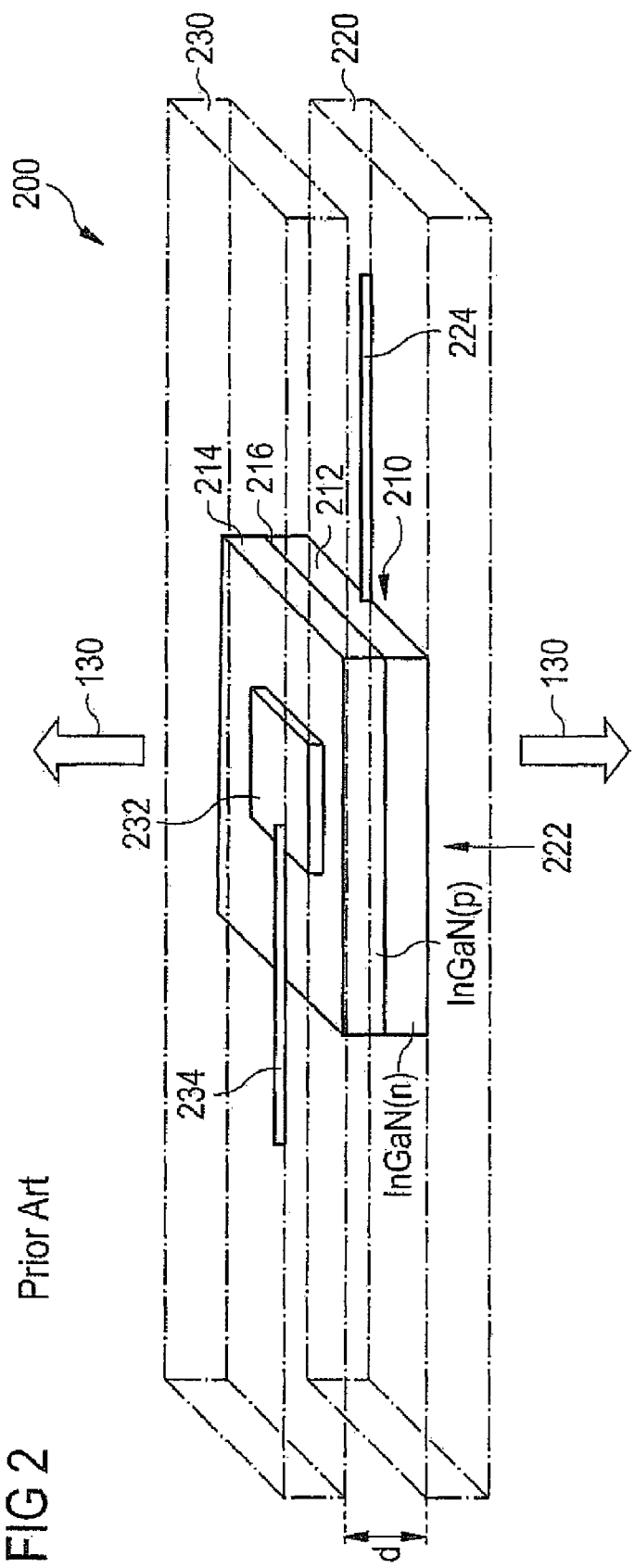
FIG. 2 shows a semiconductor diode structure for emitting electromagnetic radiation according to the prior art.

FIG. 2 shows a prior art arrangement 200 for double-sided emission of electromagnetic radiation. The arrangement 200 comprises a diode structure 210 and a first support layer 220 and a second support layer 230.

In the exemplary embodiment shown the diode structure 210 is designed for double-sided emission of electromagnetic radiation 130. Therefore, both the first support layer 220 and the second support layer 230 consist of a transparent or semi-transparent material. For example transparent films or a transparent casting compound may be used to produce the first support layer 220 and the second support layer 230.

The diode structure 210 comprises a first, negatively doped region 212 and a second, positively doped region 214. An np-junction 216 arises at an interface between the first, n-doped region 212 and the second, p-doped region 214. If an electrical current flows through the diode structure 210, majority and minority charge carriers recombine at the np-junction and emit electromagnetic radiation 130. The electromagnetic radiation 130 may be light in the visible range or outside the visible range, i.e. in particular also ultraviolet or infrared radiation.

A first contact 222 is arranged on the first, n-doped region 212. A second contact 232 is arranged on the second, p-doped region. The first contact 222 and the second contact 232 serve to supply an operating current to the diode structure 210. To this end the first contact 222 is connected to a first conductive track 224 and the second contact 232 is connected to a second conductive track 234. The first conductive track 224 is arranged in or on the first support layer 220. The second conductive track 234 is arranged in or under the second support layer 230. The conductive tracks 224 and 234 may be made, for example, from a metallic material.

In the exemplary embodiment the first, n-doped region 212 and the second, p-doped region 214 comprise a semiconductor material, for example indium gallium nitride (InGaN). Since the diode structure 210 illustrated in FIG. 2 does not comprise any additional substrate, the diode structure 210 has a relatively small thickness d, for example in the range from 5-10 μm. The small layer thickness d allows the construction of multilayer semiconductor components 100 with a relatively compact layer stack.

Figure 3:
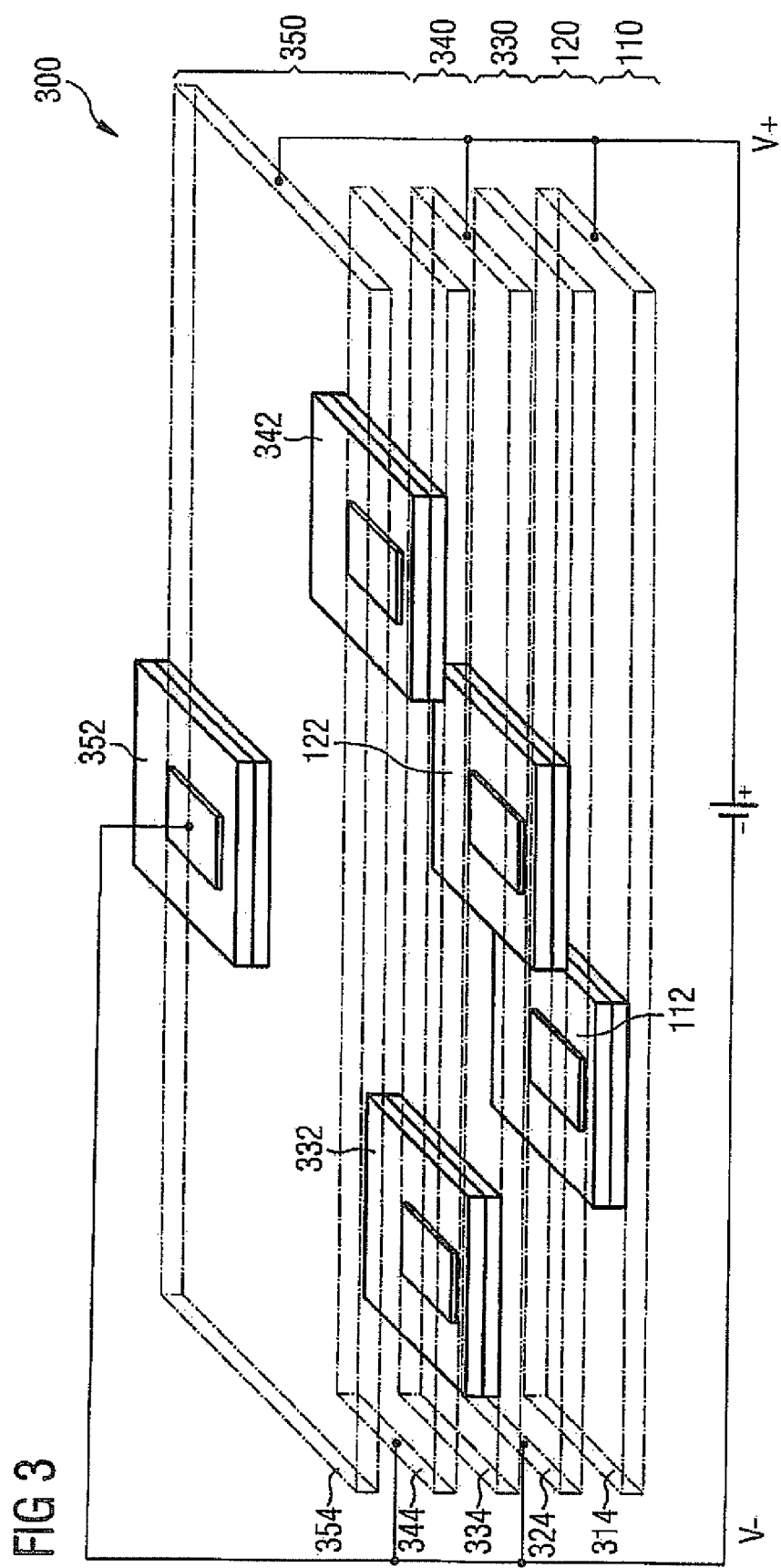
FIG. 3 shows a first layer stack with optically active regions in different planes.

FIG. 3 shows a layer stack 300. The layer stack 300 comprises five layers 110, 120, 330, 340, 350. Each of the layers 110, 120, 330, 340 and 350 comprises an optically active region 112, 122, 332, 342 and 352 respectively. Each of the layers 110, 120, 330, 340 and 350 additionally comprises an interlayer 314, 324, 334, 344 or 354, which is arranged in each case under the optically active region 112, 122, 332, 342 or 352.

Each of the optically active regions 112, 122, 332, 342 and 352 is formed by a diode structure 210, as illustrated for example in FIG. 2. By alternately applying a positive and a negative voltage $V_+$ and $V_-$, respectively to the interlayers 314, 324, 334, 344 and 354, an operating voltage is supplied to each of the diode structures 210.

The interlayers 314, 324, 334, 344, 354 may for example be layers of a metallic material. Passage regions (not shown in FIG. 3) may here be arranged in the interlayers, in order to allow the passage of electromagnetic radiation 130 from semiconductor structures 210 arranged thereabove or therebelow. Alternatively it is also possible to use a transparent or semitransparent material for the interlayers 314, 324, 334, 344, 354. Indium-tin oxide (ITO) is suitable for this purpose, for example. It goes without saying that the interlayers 314, 324, 334, 344, 354 may also be made from a non-conductive, transparent plastics material, onto which relatively thin conductive tracks are applied for supplying the operating voltage. Such conductive tracks may for example be applied by laser direct structuring (LDS). In this process the conductive tracks are written directly onto the component using a laser, a metal complex in a plastics material being activated by the laser light.

Figure 4:
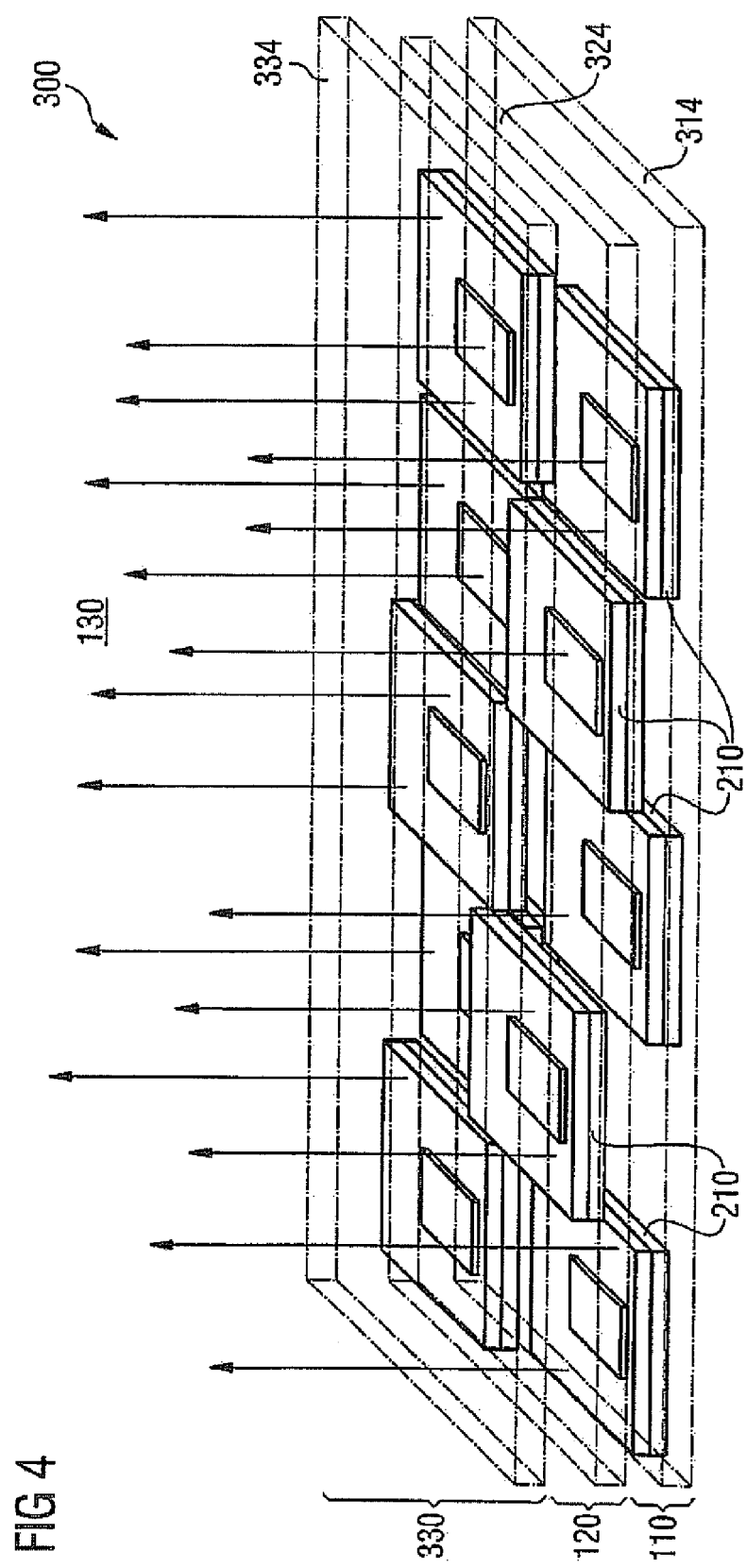
FIG. 4 shows a second layer stack with optically active regions in different planes.

FIG. 4 shows a further layer stack 400 in which ten diode structures 210 are arranged in three layers 110, 120 and 330. Each of the layers 110, 120 and 330 in each case comprises an interlayer 314, 324 or 334. The diode structures 210 are arranged spatially side by side and behind one another in the layer stack 400 according to FIG. 4. This gives rise to extensive emission of electromagnetic radiation 130 in the emission direction shown.

FIG. 5 shows a cross-section through a semiconductor component 500 according to a further configuration of the invention. FIG. 5 also shows a plan view of the semiconductor component 500.

The semiconductor component 500 comprises a first layer 110, a second layer 120 and a third layer 330. The first layer 110 comprises a first optically active region 112. The second layer 120 comprises three second optically active regions 122a to 122c. The third layer 330 comprises two third optically active regions 332a and 332b. The optically active regions 112, 122, 332 may for example be diode structures 210 according to FIG. 2.

The semiconductor component 500 additionally comprises two cooling layers 510 and 520, which respectively serve to dissipate heat generated by the optically active regions 112 and 122 when in operation. The cooling layer 510 serves to dissipate the heat from the optically active layer 112. The two-part cooling layer 520a and 520b serves to dissipate the heat respectively from the optically active regions 122a or 122b and 122c.

In the exemplary embodiment the cooling layers 510 and 520 are thermally connected to a heat sink 530. The heat sink 530 may be a housing body of the semiconductor component 500, a cooling member arranged additionally on the semiconductor component 500 or another suitable device for dissipating heat.

The cooling layers 510 and 520 may be made for example from a metallic or a ceramic material. Both metallic and ceramic materials are well suited to conducting heat. In the case of a metallic material, the cooling layers 510 or 520 may additionally serve to supply an operating voltage to the optically active regions 112 and 122.

In a particularly efficient configuration of the semiconductor component 500 the cooling layer 510 or the cooling layer 520 comprises a cavity, which is at least partially filled with a cooling liquid. Improved heat conduction may be achieved by convection of the cooling liquid in the cavity. In a further configuration a cooling liquid is pumped actively through a cavity in a cooling layer 510 or 520.

The semiconductor component 500 further comprises a reflective layer 540. The reflective layer 540 may for example be a metallic layer vapour-deposited onto the semiconductor component 500 from below, said metallic layer reflecting the electromagnetic radiation 130 from the optically active elements 112, 122, 332. In this way electromagnetic radiation 130 which is emitted by the optically active regions 112, 122, 332 in the opposite direction from the emission direction is reflected.

Finally, the semiconductor component 500 comprises a conversion layer 550. The conversion layer 550 converts electromagnetic radiation of at least one first wavelength $\lambda_1$ emitted by one of the optically active regions 112, 122, 332 into electromagnetic radiation of at least one second wavelength $\lambda_2$. It is possible, for example, to convert blue light emitted by a diode structure 210 into white light by means of a suitable conversion layer 550, parts of the electromagnetic radiation 130 being transmitted and other parts of the electromagnetic radiation being absorbed and reemitted with a greater wavelength from the conversion layer 550.

Instead of or in addition to the conversion layer, other optical elements, such as for example lenses, prisms or microstructured surfaces, may also be arranged on the layer stack, in order to adapt the beam path of the semiconductor component 500 as desired to a given requirements profile. It is also possible to make the housing itself of the semiconductor component 500 transparent, such that it itself acts as an optical element.

Moreover, one or more contacts may be provided on the housing for connection of the semiconductor component 500. If the contact(s) is/are arranged on the bottom of the housing, i.e. in the opposite direction to the emission direction, the semiconductor component 500 may be secured using so-called "surface mount technology" (SMT). If a metallic housing is used, the housing may itself serve as a terminal contact, in particular a ground contact.

FIG. 5 also shows a plan view of the semiconductor component 500. It may be seen therein that, when viewed from the direction of the predetermined emission direction, the optically active regions 112, 122, 332 arranged in the different layers 110, 120, 330 result in a homogenously luminous area 560. The luminous area 560 is bounded at its edges by a housing body 570. The housing body 57 may also be provided in part with transparent coupling-out structures, to bring about coupling-out of the electromagnetic radiation only in a specific spatial direction.

FIG. 6 shows a first plastics film 610 and a second plastics film 620. Metal coatings 612 and 622 respectively are arranged on the first plastics film 610 and the second plastics film 620. Through holes 614 and 624 are arranged in a regular grid structure in the metal coatings 612 and 622 and the plastics films 610 and 620. First and second optically active regions 112 and 122 are likewise arranged on the first plastics film 610 and the second plastics film 624 respectively. The optically active elements 112 and 122 are likewise arranged in a regular grid structure, the grid width of which corresponds to the grid width of the holes 614 and 624, respectively.

By arranging the first plastics film 610 and the second plastics film 620 one above the other, a component 600 is produced which apparently has twice as dense an arrangement of optically active elements 112 and 122 as each of the plastics films 610 and 620 on their own. To this end the second plastics film 620 is arranged over the first plastics film 610 in such a way that the optically active elements 112 of the first plastics film 610 radiate through the holes 624 in the second plastics film 620. The two plastics films 610 and 620 are supplied with an operating voltage via electrical feed lines 616 or 626. The operating voltage is in this case supplied to the individual optically active elements 112 or 122 via the metal coatings 612 and 622. The individual optically active elements 112 and 122 and the plastics films 610 and 620 may in this case be connected either in series or indeed in parallel.

If the optically active elements 112 and 122 are set up for double-sided emission, as is the case for example with the diode structure 210, the component 600 emits electromagnetic radiation 130 in two mutually opposing spatial directions. Furthermore, the configuration according to FIG. 6 is suitable for bendable semiconductor components 600, if appropriately flexible plastics films 610 and 620 are selected.

Figure 7:
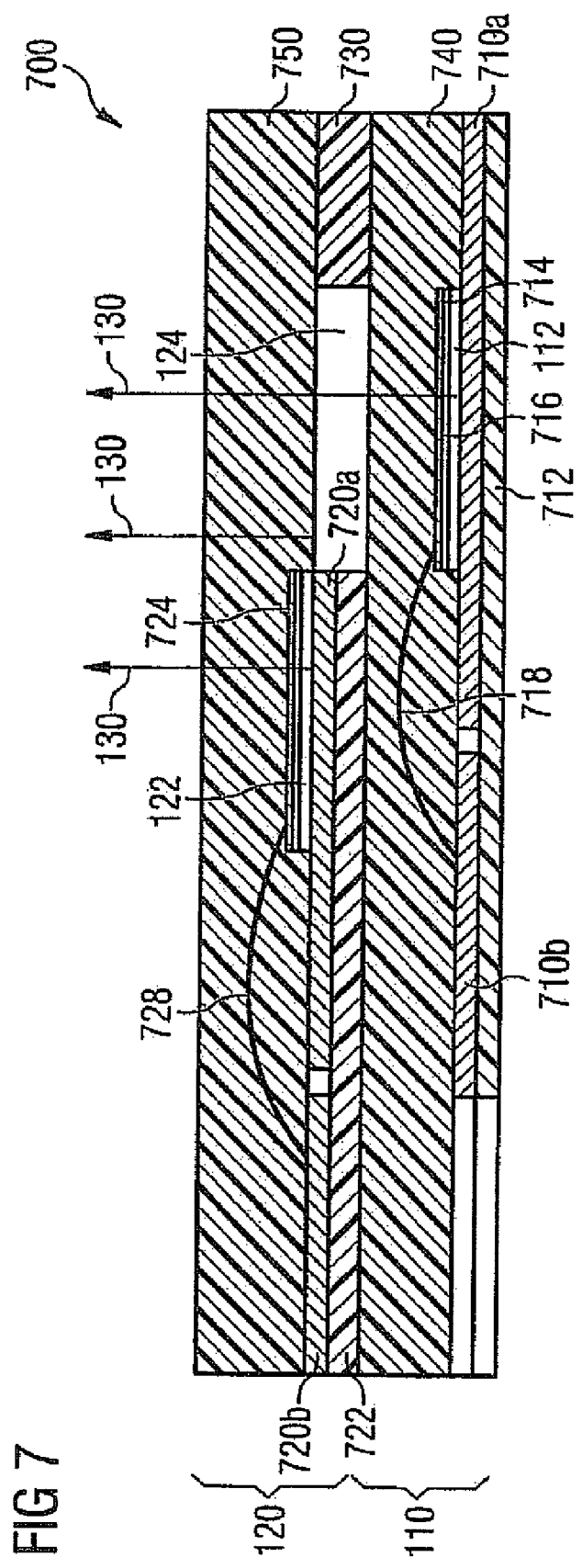
FIG. 7 shows a semiconductor component with first exemplary contacting.

FIG. 7 shows a semiconductor component 700 according to a further configuration of the invention. The semiconductor component 700 comprises a first layer 110 and a second layer 120.

The first layer 110 comprises a first optically active region 112. The second layer 120 comprises a second optically active region 122. Moreover, the first layer 110 comprises two metal foils 710a and 710b for respectively supplying and leading away an operating current. The metal foil 710 is arranged on a plastics film 712, which serves as a support material for the metal foil 710a and 710b and the first optically active region 112.

The optically active region 112 comprises for example a semiconductor chip 714 comprising a substrate 716 and a diode structure 210. In the exemplary embodiment illustrated, a first contact to the diode structure 210 is established via the metal foil 710a and the substrate 716. A second contact is established via the second metal foil 710b by means of a contacting means 718. The contacting means 718 may for example be a so-called bonding wire or a contact spring.

The second layer 120 is of similar construction to the first layer 110. In particular, the layer 120 likewise comprises a first and a second metal foil 720a and 720b, a plastics film 722 and a semiconductor chip 724. The semiconductor chip 724 is supplied with an operating voltage in an equivalent manner to the semiconductor chip 714 via a substrate 726 or a contacting means 728.

In addition, the second layer 120 has a passage region 124, which is arranged spatially over the first optically active region 112. In this region the second layer 120 comprises neither the metal foil 720 nor the plastics film 722, both of which would impair emission of the electromagnetic radiation 130 from the first optically active region 112. Finally, the second layer 120 comprises a spacer 730, which separates a casting compound 740 applied to the first layer 110 from a casting compound 750 applied to the second layer 120. The casting compound 740 and 750 respectively comprise a transparent plastics material or a synthetic resin, for example. Conversion materials, which convert electromagnetic radiation 130 from the optically active regions 112 or 122 as desired, may also be incorporated into the casting compound 740 or 750.

FIG. 8 shows a semiconductor component 800 according to a further configuration of the invention. The semiconductor component 800 comprises a first layer 110 and a second layer 120.

The first layer 110 comprises three optically active regions 112a to 112c. The second layer 120 comprises two optically active regions 122a, 122b. each of the optically active regions 112 and 122 comprises a semiconductor structure 830, in the form of diode structures with a layer thickness of approx. 100 µm. The semiconductor structures 830 according to the exemplary embodiment of FIG. 8 are contacted in a left-hand or right-hand region. To this end, the optically active regions 112a to 112c are arranged on an interrupted metallic layer 810. The interrupted metallic layer 810 produces a series circuit of the optically active regions 112a, 112b and 112c.

The optically active regions 122a and 122b are arranged on a transparent support layer 826, which transmits at least part of the electromagnetic radiation 130 from the optically active regions 112a to 112c. The support layer 826 comprises a second interrupted metallic layer 820. The metallic layer 820 serves in contacting the optically active regions 122a and 122b.

The interrupted metallic layer 820 comprises cut-outs 822a and 822b, which serve as passage regions 124a or 124b. The cut-outs 822a and 822b are bridged electrically by bridging means 824a and 824b respectively. The bridging means may for example be parts of the interrupted metallic layer 824 itself, arranged spatially in front of or behind the cut-outs 822. Alternatively, relatively thin electrical contacting means may also be used, which do not hinder the exit of electromagnetic radiation 130 or do so only insignificantly. These may take the form, for example, of bonding wires or of thin conductive tracks arranged in an additional layer.

FIG. 9 shows an optical semiconductor component 900 according to a further configuration of the invention. The optical semiconductor component 900 comprises a first layer 110 and a second layer 120.

The first layer 110 and the second layer 120 in each case comprise a transparent support layer 910 or 920 and an electrically conductive connecting layer 912 or 922. The first layer 110 comprises two optically active regions 112a and 112b. The second layer 120 comprises two optically active regions 122a and 122b. In the exemplary embodiment illustrated in FIG. 9 the optically active regions 112 and 122 are respectively embedded into the electrically conductive terminal layers 912 and 922. For example, the terminal layers 912 and 922 may be a semiconductor substrate, into which terminal regions and diode structures have been introduced by suitable doping.

The optically active regions 122a and 122b are respectively arranged over the optically active regions 112 and 112b in the direction of emitted electromagnetic radiation 130. They are partially transparent and thus act themselves as a passage region 124 for the underlying regions 112a and 112b. As a result of the optically active regions 112 and 122 being arranged congruently in the emission direction, electromagnetic radiation 130a from the first optically active regions 112a and 112b may be mixed with electromagnetic radiation 130b from the second optically active regions 122a and 122b. For example, it is possible to emit light of a first wavelength $\lambda_1$ with a first colour, for example green, by means of the optically active regions 112a and 112b. The optically active regions 122a and 122b may emit light of a second wavelength $\lambda_2$ with a second colour, for example red. By simultaneous activation of the optically active regions 112a, 112b, 122a and 122b, the impression is produced for an observer of the semiconductor component 900 of light of a third colour, for example yellow, being emitted.

In FIG. 9 the first layer and the second layer 120 are arranged spacedly. If the layers are integrated into a closed housing body, a cooling liquid may flow through an interspace 930, in order to cool particularly powerful optically active regions 112 and 122. Preferably, a cooling liquid with an elevated specific heat capacity is used, such as for instance water or alcohol, or a special coolant, such as for instance a hydrocarbon compound.

FIG. 10 shows a flowchart for a method of producing a semiconductor component.

In a first step S10 a first layer 110 is produced, with a first optically active region 112 for emitting electromagnetic radiation 130 in at least one emission direction. For example, a diode structure 210 may be produced by doping of a semiconductor material.

In a second step S20 the first layer 110 is arranged in a housing body 570 or on a support material 140. By arranging the first layer 110 on a support material 140 or in a housing body 570, electrical terminals or a thermal connection for dissipating heat generated in the first region 112 may optionally also be produced.

In a further step S30 a second layer 120 is produced with at least one optically active second region 122 for emitting electromagnetic radiation 130. At least one first passage region 124 is incorporated into the second layer 120. The passage region 124 may be produced for example by producing a cut-out or by introducing a transparent or semitransparent material into the second layer 120.

In a further step S40 the second layer 120 is arranged on the first layer 110, wherein the at least one passage region 124 is arranged over the at least one optically active region 112 of the first layer 110. Alignment may be effected for example by means of predetermined grid structures. It is also possible to grow the second layer directly onto the first layer, all known lithographic methods being available to a person skilled in the art for this purpose.

Optionally, the steps S30 and S40 may be repeated for further layers 330, 340 or 350, until a desired layer stack 300 or 400 has been produced.

In addition, optional further layers, for instance cooling layers 510 or 520, reflective layers 540, conversion layers 550 or terminal layers 912 or 922, may be incorporated into a layer stack 300 or 400 during production.

The above-stated sequence of steps serves merely to explain the production method described. However, depending on the process, another sequence of steps is possible, or the steps may be performed in parallel.

Likewise, all the features disclosed in the individual exemplary embodiments may be combined together in many different ways, in order to arrive at further embodiments. In particular, the description made with reference to the exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A semiconductor component comprising:
   at least one optically active first region for emitting electromagnetic radiation in at least one emission direction; and
   at least one optically active second region for emitting electromagnetic radiation in the at least one emission direction,
   wherein the first region is arranged in a first layer and the second region in a second layer, the second layer being arranged over the first layer in the emission direction and comprising a first passage region assigned to the first region, which first passage region is at least partially transmissive for the electromagnetic radiation of the first region.

2. The semiconductor component according to claim 1, wherein the second layer has at least one cut-out in the first passage region to allow passage of the electromagnetic radiation from the first layer.

3. The semiconductor component according to claim 2, wherein the second layer comprises a metallic material with at least one cut-out in the first passage region.

4. The semiconductor component according to claim 1, wherein the second layer has at least one transparent or semi-transparent material in the first passage region to allow passage of the electromagnetic radiation from the first layer.

5. The semiconductor component according to claim 1, wherein at least one layer of a metallic material is arranged between the first and second layers, which layer comprises at least one cut-out in a second passage region assigned to the first region.

6. The semiconductor component according to claim 1, wherein the first passage region and the second region are spatially adjacent one another and form a continuous emission region.

7. The semiconductor component according to claim 1, wherein the at least first and second layers are arranged in a common housing body and the housing body comprises an optical element, which converts electromagnetic radiation emitted by the first and/or second region in a predetermined manner, in particular by frequency conversion, diffraction, refraction and/or filtering.

8. The semiconductor component according to claim 1, wherein the first and/or second region take the form of substrate-less semiconductor structures.

9. The semiconductor component according to claim 8, wherein the first and/or second regions is/are operable to emit electromagnetic radiation in the emission direction and a direction opposed thereto.

10. The semiconductor component according to claim 1, wherein at least one cooling layer is arranged between the first and second layers for dissipating heat from the first and/or second region, which cooling layer is partially transparent at least in a second passage region assigned to the first region.

11. The semiconductor component according to claim 10, wherein the cooling layer comprises a cavity at least partially filled with a cooling liquid.

12. The semiconductor component according to claim 1, wherein the first and the second region are arranged one above the other in the emission direction.

13. The semiconductor component according to claim 1, wherein the first and/or second layer comprise(s) a plurality of optically active regions for emitting electromagnetic radiation and a first passage region of the second layer is assigned to each optically active region of the first layer.

14. The semiconductor component according to claim 1, wherein the semiconductor component comprises a plurality of layers arranged one above the other with in each case at least one optically active region for emitting electromagnetic radiation, each overlying layer comprising at least one passage region for electromagnetic radiation from an underlying layer.

15. A method for producing a semiconductor component comprising:
 producing a first layer with at least one optically active first region for emitting electromagnetic radiation in at least one emission direction;
 arranging the first layer in a housing body or on a support material;
 producing a second layer with at least one optically active second region for emitting electromagnetic radiation and at least one transparent or semitransparent passage region; and
 arranging the second layer on the first layer, wherein the passage region of the second layer is arranged over the first region of the first layer in the passage direction.

16. The semiconductor component according to claim 8, wherein the first and/or second region take the form of diode structures.

* * * * *